United States Patent [19]

Migitaka et al.

[11] 4,028,718

[45] June 7, 1977

[54] SEMICONDUCTOR HALL ELEMENT

[75] Inventors: Masatoshi Migitaka, Kokubunji; Yozo Kanda, Hamamatsu, both of Japan

[73] Assignee: Hitachi, Ltd., Japan

[22] Filed: Oct. 28, 1975

[21] Appl. No.: 626,454

[30] Foreign Application Priority Data

Dec. 25, 1974 Japan .......................... 49-148052

[52] U.S. Cl. .............................. 357/27; 307/309; 357/56
[51] Int. Cl.² ...................................... H01L 29/82
[58] Field of Search .................. 357/27, 25, 56; 307/309

[56] References Cited

UNITED STATES PATENTS 3,260,980  7/1966  Weiss ................................ 357/27
3,823,354  7/1954  Janssen ............................. 357/27

OTHER PUBLICATIONS

Hollis, "Micro–electronic Magnetic Transducers," *MEASUREMENT AND CONTROL*, vol. 6, Jan. 1973, pp. 38–40.

*Primary Examiner*—Michael J. Lynch
*Assistant Examiner*—James W. Davie
*Attorney, Agent, or Firm*—Craig & Antonelli

[57] ABSTRACT

A semiconductor Hall element consists of a substantially rectangular main island and at least one small island of semiconductor material, one conductivity type disposed in an epitaxial semiconductor layer grown on a single crystal semiconductor substrate of the opposite conductivity type. In the main island, a pair of highly doped elongated current terminal regions of the one conductivity type are disposed, so that they are near and substantially parallel to a pair of sides of the main island, which are opposite to each other. At least a highly doped Hall signal voltage terminal semiconductor region of the one conductivity type is disposed in the small island. The Hall signal voltage terminal region has a protrusion having a small cross section, the extremity of which is slightly beyond one side of the main island which is perpendicular to the current terminal regions.

14 Claims, 7 Drawing Figures

SEMICONDUCTOR HALL ELEMENT

BACKGROUND OF THE INVENTION

1. Field of the Invention

The present invention relates to a semiconductor Hall element formed in an epitaxial layer of one conductivity type grown on a single crystal silicon substrate of the opposite conductivity type.

2. Description of the Prior Art

In line with a recent tendency to integrate more and more semiconductor devices, several attempts have been made to integrate a Hall element in a single crystal semiconductor body together with other circuit elements. One of these attempts is described in U.S. Pat. No. 3,522,494, according to which a semiconductor Hall element is formed in an epitaxial layer having a high resistivity of one conductivity type grown on a single crystal silicon substrate of the opposite conductivity type. The epitaxial layer contains a region of the opposite conductivity type extending from the surface of the epitaxial layer to the substrate forming a boundary p-n junction which, with the p-n junction at the substrate interface, defines in the epitaxial layer an island constituting a Hall element. In the island, a pair of highly doped current terminal regions of the one conductivity type are disposed opposite each other. A pair of highly doped Hall signal voltage terminals of the one conductivity type are also disposed in the island, so that a line connecting the Hall signal voltage terminals is substantially perpendicular to electric current passing through the highly doped current terminal regions. Such a Hall element structure has disadvantages that electric current passing under and outside of the Hall signal voltage terminals reduces Hall signals and that since minor changes of conditions vary electric current paths, fluctuations of characteristics among different Hall elements are great.

The Hall element disclosed in U.S. Pat. No. 3,823,354 can partly remove these disadvantages. In this element, an island of one conductivity type constituting a Hall element consists of a substantially rectangular main part and a pair of small substantially rectangular protrusions which are contiguous to a pair of sides of the main part, which are opposite to each other. A pair of highly doped current terminal regions of the one conductivity type are disposed opposite to each other in the main part of the island and another pair of highly doped Hall signal voltage terminal regions of the one conductivity type are disposed in the small substantially rectangular protrusions so that a line connecting the Hall signal voltage terminals is substantially perpendicular to an electric current passing through the highly doped current terminal regions. By using this structure, since only a small current passes under and outside of the Hall signal voltage terminals, it is possible to obtain great Hall signals and to reduce fluctuations in characteristics among different Hall elements. However, since the Hall signal voltage terminal regions should have a sufficiently large area so that they have a sufficiently small contact resistance, they are necessarily long in the direction of the Hall current and shortcircuit part of the Hall voltage. Therefore, one cannot obtain as intense a Hall voltage signal as expected. Moreover, by this structure the offset voltage, which is one of the most important factors from the practical point of view, has a tendency to increase and fluctuations in characteristics among different Hall elements are also great.

In general, by measuring a static magnetic field by means of a Hall element a signal to noise ratio is determined principally by a signal to offset voltage ratio, because a so-called noise level is less than one thousandth of that of signals. Consequently, if an offset voltage is great, no highly effective sensitivity can be obtained even for great Hall signal voltages. Moreover, it is found that the offset voltage varies with a number of factors so that its temperature dependence is complicated and its fluctuations among different Hall elements are great. These disadvantages would be removed, if the Hall signal voltage terminals were disposed in separate islands which are connected to the main part of the Hall element through bridges having a small cross section of the one conductivity type. However, this structure has another disadvantage that the bridges increase the electric resistance between the main part of the Hall element and the Hall signal voltage terminals. In case the electric resistance of Hall signal voltage terminals is great, the Hall signal voltage varies considerably with small variations in the electric current passing through the Hall signal voltage terminal. Moreover, since the resistance is changed by a magnetoresistance effect, a great resistance impairs the linear dependence of the Hall signal voltage on the magnetic field intensity, which is one of the most important features of a Hall element. It was known also that, in case a Hall signal voltage is constituted by a difference in the potentials of a pair of Hall signal voltage terminals, an offset voltage is produced by non-homogeneous distribution of electric resistivity in a utilized crystal as well as by a geometrical asymmetry of the Hall signal voltage terminals.

According to experiments of the inventors of this invention, the offset voltage also varies considerably with changes in the current path due to slight apparent variations in resistance or due to variations in contact resistance of Hall signal voltage terminals, if the Hall signal voltage terminal does not exceed the boundary of the main island but only touches the latter.

SUMMARY OF THE INVENTION

It is the object of the invention to provide a semiconductor Hall element which can be simply manufactured and has excellent characteristics such as stability, low offset voltage, etc.

According to the invention, a semiconductor Hall element consists of a substantially rectangular main island and at least one small island of one conductivity type disposed in an epitaxial semiconductor layer grown on a single crystal semiconductor substrated of the opposite conductivity type. In the main island a pair of highly doped elongated current terminal regions of the one conductivity type are disposed so that they are near and substantially parallel to a pair of sides of the main island, which are opposite to each other. At least a highly doped Hall signal voltage terminal region of the one conductivity type is disposed in the small island. The Hall signal voltage terminal region has a protrusion having a small cross section, the extremity of which is slightly beyond one side of the main island which is the perpendicular to the current terminal regions.

DETAILED DESCRIPTION

Embodiment 1

Figure 1:
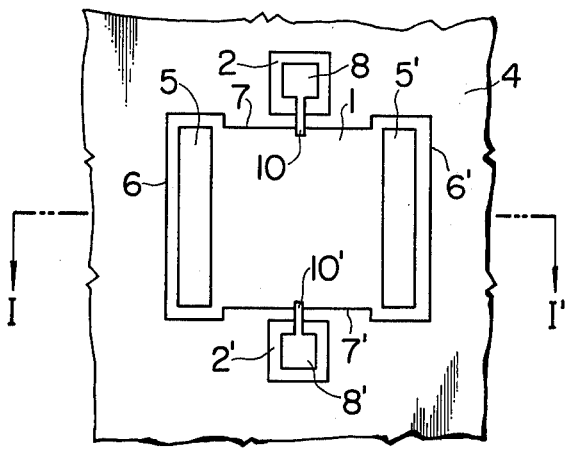
FIG. 1 diagrammatically shows a plan view of a Hall element of silicon according to this invention.
Figure 2:
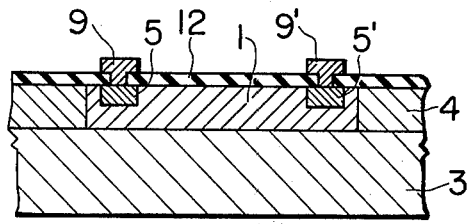
FIG. 2 is a cross-sectional view taken on the line I – I' in FIG. 1.

FIG. 1 diagrammatically shows a plan view of an example of a Hall element of silicon and FIG. 2 is a cross-sectional view taken along the line I – I' in FIG. 1. The Hall element shown in FIGS. 1 and 2 comprises a substantially rectangular main island 1 and two small islands 2 and 2' formed in an epitaxial layer about 10 $\mu$ m thick of n conductivity type having a resistivity of 0.7 $\Omega$ cm grown on a surface (110) of a silicon substrate 3 of p conductivity type having a resistivity of 10 ~ 20 $\Omega$ cm by converting the other part 4 of the epitaxial layer to the p conductivity type by boron diffusion. In the main island 1, a pair of elongated current terminal regions 5 and 5' about 1.5 $\mu$ m deep, highly doped with phosphorus, are near and substantially parallel to a pair of sides 6 and 6' of the main island 1, which sides are opposite each other. Both the length of the elongated terminal regions 5 and 5' and the distance between the inner sides of the regions 5 and 5' which are opposite each other, are 500 $\mu$ m. The length of the elongated current terminal regions 5 and 5' is substantially equal to the width of the substantially rectangular main island, so that an electric current flows along approximately parallel lines from one of the current terminal regions to the other when an appropriate voltage is applied between them. Since the highly doped current terminal regions should be separated from the part 4 converted to the p conductivity type, the width of the main island near the current terminal regions is slightly larger than that of the central portion of the main island, the main island has been described as being substantially rectangular.

The two small islands 2 and 2' are disposed opposite a pair of sides 7 and 7' of the main island 1 which are opposite each other and perpendicular to the current terminal regions 5 and 5'. In each island a Hall signal voltage terminal region 8 or 8', which is highly doped with phosphorus, is advantageously formed at the same time as the current terminal regions 5 and 5'. This voltage terminal region 8 or 8' has a protrusion 10 or 10' having a small cross section also highly doped with phosphorus, one of the extremities of which is in contact with the voltage terminal region and the other of which is slightly beyond the side of the main island, in front of which the small island is located.

The part of the protrusion which is inside of the main island should be narrow as possible in order to generate Hall signals with amplitudes as large as possible. However, according to photolithographic techniques, it is difficult to reduce the width of a diffusion region to less than 1 $\mu$ m. If the extremity of the protrusion did not exceed the side 7 of the main island but only touched it, Hall signals would be influenced considerably by variations in electric current path in its neighborhood produced by very small changes of resistivity and minor variations of surface state, and the offset voltage would be increased. In order that the Hall signals will not be influenced by variations in the electric current path, the protrusion should overlap the side 7 or 7' of the main island by at least 1 $\mu$ m. However, the length of the part of the protrusion overlapping the side 7 or 7' may be less than 5 $\mu$ m. On the other hand, it is not preferable that the protrusion overlap the side 7 or 7' too much, because the part of the protrusion inside of the main island 1 influences the electric current path and reduces the effective length of the current terminal regions, thus decreasing the sensitivity of the Hall element. In any case, the length of the part of the protrusion inside of the main island should not exceed a quarter of the length of the current terminal regions 5 and 5'.

The upper surface of the epitaxial layer is covered with an $SiO_2$ layer 12 having holes at predetermined positions for a pair of current terminals 9 and 9' and a pair of Hall signal voltage terminals made of aluminum. These aluminum terminals are not shown in FIG. 1 for the sake of simplicity.

A Hall element thus constructed having an extremity of the protrusion about 5 $\mu$ m long and 1 $\mu$ m wide generates Hall signals of 424 mV, which are twice as large as those obtained by using a conventional Hall element in which a pair of voltage terminal regions are formed in the main island and which has the same construction, as described above, except for the voltage terminal regions. The latter generate Hall signals of 226 mV. Likewise, the offset voltage is reduced from 1 mV to 0.5 mV.

Embodiment 2

Figure 3:
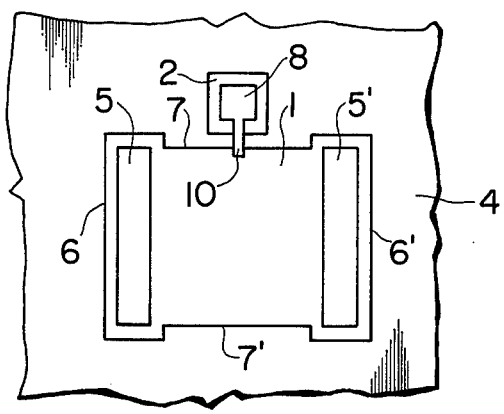
FIG. 3 is a plan view of another hall element of silicon according to the invention.

The Hall element shown in FIG. 3 differs from that shown in FIG. 1 in that the former has only one voltage terminal region. All the reference numerals in FIG. 3 designate the same as those indicated by the same numerals in FIG. 1. It is evident that this type of the Hall element can be used by connecting it to an external electronic circuit so that the voltage terminal region has a potential which is the average of two potentials at the current terminal regions.

Figure 4:
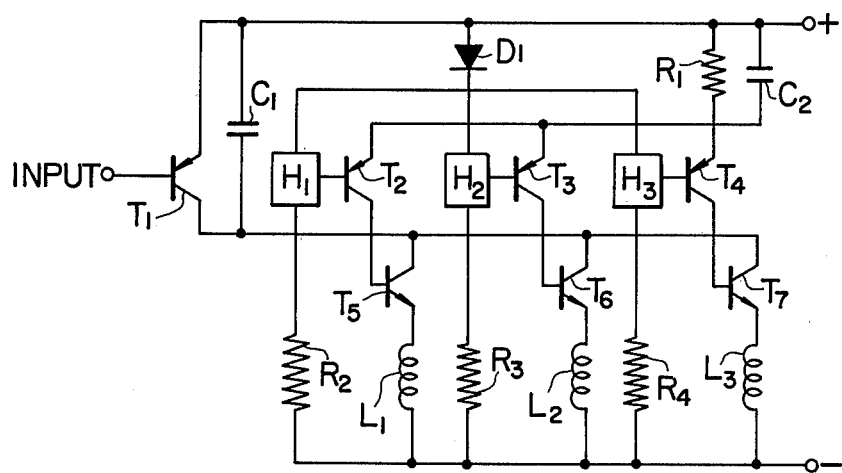
FIG. 4 is a circuit diagram for driving the Hall element shown in FIG. 3.

FIG. 4 shows an example of such an electronic circuit for driving a direct current brushless motor having three poles, in which $H_1$, $H_2$, and $H_3$ represent Hall elements $L_1$, $L_2$, and $L_3$ are inductive loads, $T_1$ is a transistor which switches the entire circuit, $T_2$, $T_3$, and $T_4$ are transistors driven respectively by Hall elements $H_1$, $H_2$, and $H_3$ and driving transistors $T_5$, $T_6$, and $T_7$, respectively, $R_1$, $R_2$, $R_3$, and $R_4$ are resistances regulating the potential at the voltage terminal region of the Hall elements, $C_1$ and $C_2$ are capacitors absorbing surge pulses, and $D_1$ is a diode.

In Hall elements having one Hall signal voltage terminal, fluctuations of the potential at the terminal among different Hall elements should be held as low as possible. This is performed by applying the same techniques as described in Embodiment 1 for reducing the offset voltage of Hall elements having two Hall signal voltage terminals.

Embodiment 3

In the Hall elements described in Embodiments 2 and 3 there exist one or two p-n$^+$ junctions. These junctions have a low breakdown voltage of about 5 V. Consequently, in these type of Hall elements, when the bias voltage applied to the Hall signal voltage terminal is high, Hall signals are dropped out, or noise is increased. In case a high bias voltage is applied to the Hall signal voltage terminal, all highly doped n conductivity type regions should be surrounded by a relatively high resistivity region.

Figure 5:
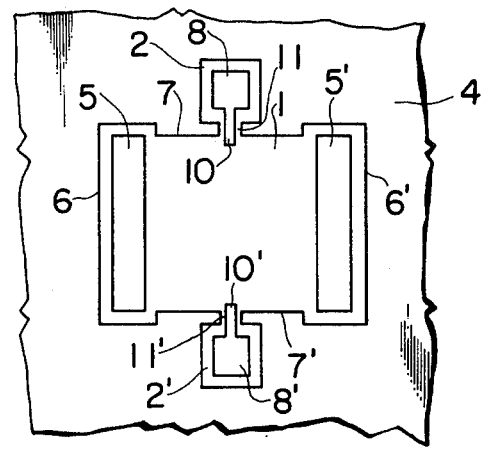
FIG. 5 is a plan view of still another Hall element of silicon according to this invention.

For this purpose, as shown in FIG. 5, in which the reference numerals except for 11 and 11' designate the same elements as those indicated by the same numerals in FIG. 1, the main island 1 and the small islands 2 and 2' are connected by bridges 11 and 11' having the same resistivity as that of the main island 1 and the small islands 2 and 2', which separate the protrusions 10 and 10' from the p conductivity type region 4. In this way the drawbacks that Hall signals are dropped out and that noise is increased for a high bias voltage are eliminated.

It is evident that the Hall element shown in FIG. 3 has the same drawbacks as mentioned above and that they can be removed in the same way.

EMBODIMENT 4

As is well known, the main island constituting a principal part of a Hall element should have a well defined impurity concentration. This can be performed by ion implantation techniques.

A high resistivity silicon layer of n conductivity type is epitaxially grown on a surface (110) of p conductivity type. This epitaxially grown layer is covered with an SiO$_2$ layer 7000 A thick. A window is formed in this SiO$_2$ layer by well-known photolithographic techniques, so that only the region indicated by 4 in FIG. 5 is covered with a mask. Through this mask, P$^+$ ions are implanted in the epitaxially grown layer at a dose of 5 $\times$ 10$^{12}$ cm$^{116\ 2}$ with an energy of 100 keV. Next, the mask is removed by using an etching solution. A Hall element is formed as described in Embodiment 3. In this way, the impurity concentration in the principal of a Hall element can be controlled by measuring the dose of implanted ions and fluctuations in the offset voltage among different Hall elements, which depend principally upon fluctuations in impurity concentrations in the n conductivity type epitaxially grown layer, is considerably reduced.

EMBODIMENT 5

The Hall signal voltage is proportional to the electron mobility of the semiconductor constituting a Hall element. Since gallium arsenide has a greater electron mobility than silicon, a gallium arsenide Hall element produces Hall signals of amplitudes greater than those obtained by using a silicon Hall element, which is geometrically identical to the gallium arsenide Hall element.

Figure 6:
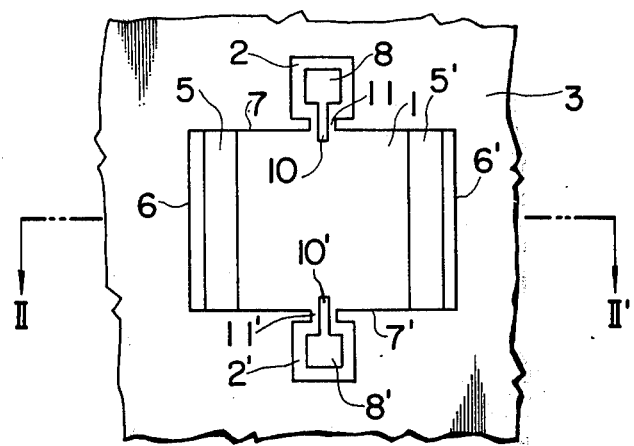
FIG. 6 is a plan view of a Hall element of gallium arsenide according to this invention.
Figure 7:
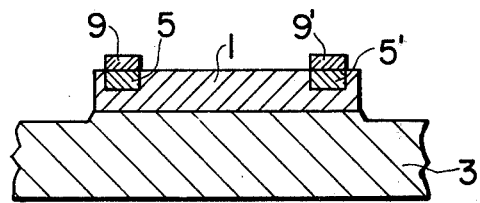
FIG. 7 is a cross-sectional view taken on the line II – II' in FIG. 6.

FIG. 6 diagrammatically shows a plan view of an example of a Hall element of gallium arsenide and FIG. 7 is a cross-sectional view taken on the line II–II' in FIG. 6. All the reference numerals in FIGS. 6 and 7 designate the corresponding parts indicated by the same numerals in FIGS. 2 and 5.

Since it is more difficult to obtain a fine pattern by impurity diffusion for gallium arsenide than for silicon, it is preferable to isolate the main island 1, the small islands 2 and 2', and the bridges 11 and 11' by mesa etching, as shown in FIG. 7, than by isolation diffusion. In this case the current terminal regions 5 and 5' can extend completely between a pair of sides 7 and 7' of the substantially rectangular main island 1.

A Hall element of gallium arsenide shown in FIGS. 6 and 7 can be manufactured typically as follows. An epitaxial layer 4 $\mu$m thick of n conductivity type gallium arsenide is grown on a surface (100) of a semi-insulating gallium arsenide substrate having a resistivity of 0.8 Ω cm. A layer of SiO$_2$ is formed on an outer surface of the epitaxial layer. The parts of this layer corresponding to the highly doped current terminal regions 5 and 5', the highly doped Hall signal terminal regions, and the protrusions are removed by the well-known photolithographic method for making a mask. Through this mask sulfur is diffused into the epitaxial layer. After having removed the layer of SiO$_2$, a new layer of SiO$_2$ is deposited on the outer surface of the epitaxial layer and windows for two current terminals and two Hall signal voltage terminals are formed in it. Through these windows, two current terminals and two Hall signal voltage terminals made of Au-Ge-Ni are deposited on the corresponding regions. The layer of SiO$_2$ is removed by well-known photolithographic techniques, except for the part on the main island, the small islands and the bridges, and the part of the epitaxial layer, which is not covered by the remaining layer of SiO$_2$, as well as a corresponding surface portion of the substrate is etched off in order to obtain a mesa type Hall element as indicated in FIGS. 6 and 7.

A Hall element of gallium arsenide gives results as good as the Hall elements of silicon described in the preceding Embodiments.

What is claimed is:
1. A semiconductor Hall element comprising:
   a semiconductor substrate including a first semiconductor layer of a first conductivity type and having a first surface;
   a first semiconductor region of a second conductivity type, opposite said first conductivity type and having a substantially rectangularly shaped surface area, disposed beneath and extending to said first surface of sadi substrate;
   a second semiconductor region of said second conductivity type, having a prescribed shaped surface area less than that of said first semiconductor region disposed beneath and extending to said first surface of said substrate, adjacent to, but spaced apart from, a first side of said first semiconductor region;
   third and fourth elongated semiconductor regions of said second conductivity type and an impurity concentration higher than that of said first semiconductor region, disposed in said first semiconductor region along second and third parallel sides thereof perpendicular to said first side of said first semiconductor region;
   a fifth semiconductor region, of said second conductivity type and having an impurity concentration higher than that of said second semiconductor region, disposed in said second semiconductor region;
   a sixth semiconductor region, of said second conductivity type, disposed beneath and extending to said first surface of said substrate and being contiguous with said first and second semiconductor regions; and a seventh semiconductor region of said second conductivity type and having an impurity concentration higher than that of said first semiconductor region, disposed in said sixth semiconductor region so as to be contiguous with said fifth semiconductor region and overlapping said first side of said first semiconductor region.

2. A semiconductor Hall element according to claim 1, said substrate further comprising a second semiconductor layer of said first conductivity type upon which said first semiconductor layer is disposed, so that said first, second, fifth, sixth and seventh semiconductor regions are surrounded by isolation semiconductor material of said first conductivity type.

3. A semiconductor Hall element according to claim 1, wherein the semiconductor material of which said first semiconductor layer of said substrate is made is a material selected from the group consisting of silicon and gallium arsenide.

4. A semiconductor Hall element according to claim 3, wherein said semiconductor material is silicon.

5. A semiconductor Hall element according to claim 3, wherein said semiconductor material is gallium arsenide.

6. A semiconductor Hall element according to claim 1, wherein the distance by which said seventh region overlaps said first side of said first semiconductor region is greater than 1 $\mu$m but less than one-quarter of the length of said third and fourth semiconductor regions along the second and third parallel sides of said first semiconductor region.

7. A semiconductor Hall element according to claim 1, wherein the distance by which said seventh region overlaps said first side of said first semiconductor region is greater than 5 $\mu$m but less than one-quarter of the length of said third and fourth semiconductor regions along the second and third parallel sides of said first semiconductor region.

8. A semiconductor Hall element according to claim 1, further comprising:
an eighth semiconductor region of said second conductivity type, having a prescribed shaped surface area less than that of said first semiconductor region, disposed beneath and extending to said first surface of said substrate, adjacent to, but spaced apart from, a fourth side of said first semiconductor region, parallel with said first side thereof;
a ninth semiconductor region, of said second conductivity type, and having an impurity concentration higher than that of said eighth semiconductor region, disposed in said eighth semiconductor region;
a tenth semiconductor region, of said second conductivity type, disposed beneath and extending to said first surface of said substrate and being contiguous with said first and second semiconductor regions; and
an eleventh semiconductor region, of said second conductivity type and having an impurity concentration higher than that of said first semiconductor region, disposed in said tenth semiconductor region so as to be contiguous with said ninth semiconductor region and overlapping said fourth side of said first semiconductor region.

9. A semiconductor Hall element comprising:
a semiconductor substrate of a first conductivity type having a first surface;
a semiconductor layer of a second conductivity type, opposite said first conductivity type, disposed on said substrate and having
a first substantially rectangularly shaped portion,
a second rectangularly shaped portion, smaller than said first portion, adjacent to, but spaced apart from, a first side of said first portions, and
a third portion narrower than said second portion interconnecting said first and second portions;
first and second elongated semiconductor regions of said second conductivity type and an impurity concentration higher than that of said semiconductor layer, disposed in said first portion of said semiconductor layer along second and third parallel sides thereof, perpendicular to said first side of said first portion of said semiconductor layer;
a third semiconductor region of said second conductivity type and having an impurity concentration higher than that of said semiconductor layer, disposed in said second portion of said semiconductor layer; and
a fourth semiconductor region of said second conductivity type, and having an impurity concentration higher than that of said semiconductor layer, disposed in said third portion of said semiconductor layer so as to be contiguous with said third region and overlapping said first side of said first portion of said semiconductor layer.

10. A semiconductor Hall element according to claim 9, wherein the semiconductor material of which said substrate is made is a material selected from the group consisting of silicon and gallium arsenide.

11. A semiconductor Hall element according to claim 10, wherein said semiconductor material is gallium arsenide.

12. A semiconductor Hall element according to claim 10, wherein said semiconductor material is silicon.

13. A semiconductor Hall element according to claim 9, wherein the distance by which said fourth region overlaps said first side of said first portion of said semiconductor layer is greater than 1 $\mu$ m but less than a quarter of the length of said first and second elongated semiconductor regions along the second and third parallel sides of said first portion of said semiconductor layer.

14. A semiconductor Hall element according to claim 9, wherein
said semiconductor layer further comprises
a fourth rectangularly shaped portion, smaller than said first portion, adjacent to, but spaced apart from, a fourth side of said first portion, parallel with said first side thereof, and
a fifth portion narrower than said fourth portion interconnecting said first and fourth portions; and further including
a fifth semiconductor region, of said second conductivity type and having an impurity concentration higher than that of said semiconductor layer, disposed in said fourth portion of said semiconductor layer; and
a sixth semiconductor region of said second conductivity type, and having an impurity concentration higher than that of said semiconductor layer, disposed in said fifth portion of said semiconductor layer so as to be contiguous with said fifth region and overlapping said fourth side of said first portion of said semiconductor layer.

* * * * *